United States Patent
Schiaffino et al.

(10) Patent No.: US 9,324,927 B2
(45) Date of Patent: Apr. 26, 2016

(54) SEMICONDUCTOR LIGHT EMITTING DEVICE WITH THICK METAL LAYERS

(71) Applicant: KONINKLIJKE PHILIPS N.V., Eindhoven (NL)

(72) Inventors: Stefano Schiaffino, Pleasanton, CA (US); Alexander H. Nickel, Santa Clara, CA (US); Jipu Lei, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 37 days.

(21) Appl. No.: 14/362,144

(22) PCT Filed: Dec. 4, 2012

(86) PCT No.: PCT/IB2012/056940
§ 371 (c)(1),
(2) Date: Jun. 2, 2014

(87) PCT Pub. No.: WO2013/084144
PCT Pub. Date: Jun. 13, 2013

(65) Prior Publication Data
US 2014/0339597 A1    Nov. 20, 2014

Related U.S. Application Data

(60) Provisional application No. 61/568,287, filed on Dec. 8, 2011.

(51) Int. Cl.
*H01L 33/00* (2010.01)
*H01L 33/62* (2010.01)
*H01L 33/38* (2010.01)

(52) U.S. Cl.
CPC ............. *H01L 33/62* (2013.01); *H01L 33/005* (2013.01); *H01L 33/0079* (2013.01); *H01L 33/38* (2013.01); *H01L 33/382* (2013.01); *H01L 2924/0002* (2013.01); *H01L 2933/0033* (2013.01)

(58) Field of Classification Search
CPC ................. H01L 2924/00; H01L 2924/00014; H01L 33/32; H01L 2924/12041; H01L 2224/48091; H01L 29/7869; H01L 2924/13091; H01L 33/62; H01L 2224/73265; H01L 2224/32225; H01L 2224/48227; H01L 2924/0002
USPC ......... 257/43, 98, 99, 88, 13, 40, 432, 76, 14, 257/15, 24, 296, 31, 329, 459, 66, 690, 724, 257/735, 737, 82; 438/104, 29, 26, 27, 46, 438/107, 31, 47, 72, 124, 15, 22, 28, 33, 34, 438/478, 5, 64, 65
See application file for complete search history.

(56) References Cited

U.S. PATENT DOCUMENTS

| 7,348,212 B2 | 3/2008 | Schiaffino et al. |
| 2008/0105981 A1 | 5/2008 | Kaneko |
| 2011/0204395 A1 | 8/2011 | Hong et al. |

FOREIGN PATENT DOCUMENTS

| EP | 2393131 A1 | 12/2011 |
| EP | 2393135 A1 | 12/2011 |

*Primary Examiner* — Robert Bachner

(57) ABSTRACT

A device according to embodiments of the invention includes a semiconductor structure including a light emitting layer sandwiched between an n-type region and a p-type region and first and second metal contacts, wherein the first metal contact is in direct contact with the n-type region and the second metal contact is in direct contact with the p-type region. First and second metal layers are disposed on the first and second metal contacts, respectively. The first and second metal layers are sufficiently thick to mechanically support the semiconductor structure. A sidewall of one of the first and second metal layers comprises a three-dimensional feature.

17 Claims, 6 Drawing Sheets

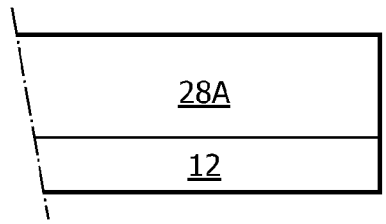
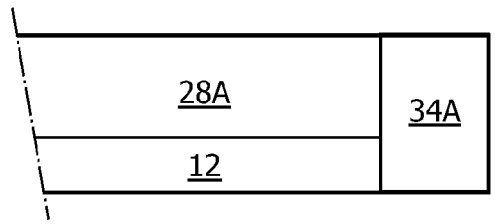
FIG. 16  FIG. 17
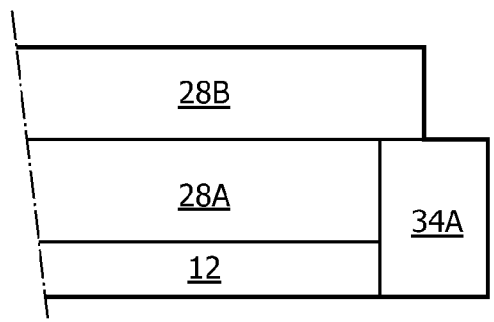
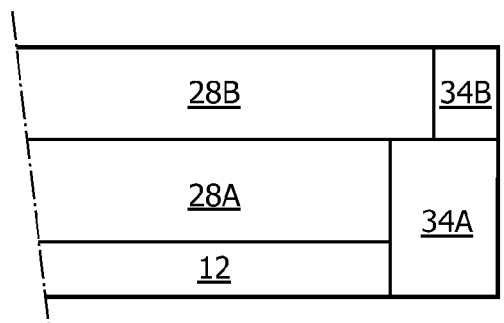
FIG. 18  FIG. 19
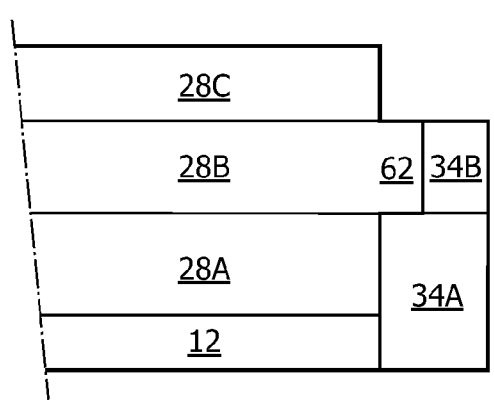
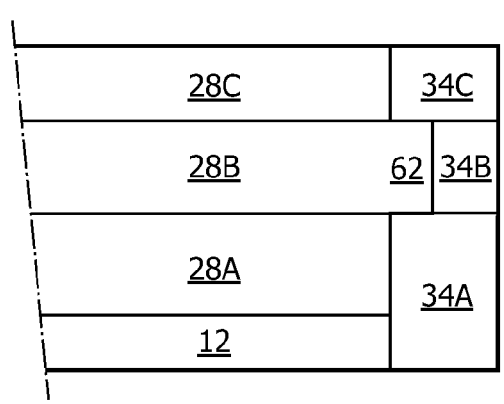
FIG. 20  FIG. 21
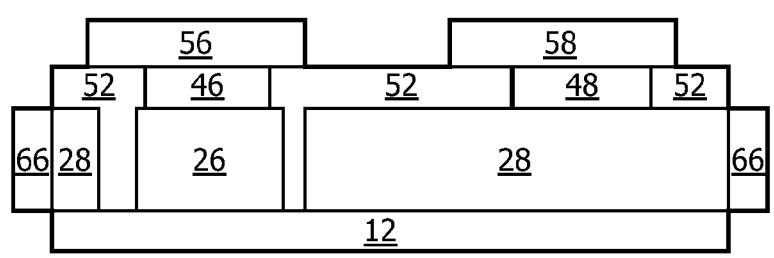
FIG. 22

US 9,324,927 B2

SEMICONDUCTOR LIGHT EMITTING DEVICE WITH THICK METAL LAYERS

CROSS-REFERENCE TO PRIOR APPLICATIONS

This application is the U.S. National Phase application under 35 U.S.C. §371 of International Application No. PCT/IB2012/056940, filed on Dec. 4, 2012, which claims the benefit of U.S. Patent Application No. 61/568,287, filed on Dec. 8, 2011. These applications are hereby incorporated by reference herein.

BACKGROUND

1. Field of Invention

The present invention relates to a semiconductor light emitting device with thick metal layers.

2. Description of Related Art

Semiconductor light-emitting devices including light emitting diodes (LEDs), resonant cavity light emitting diodes (RCLEDs), vertical cavity laser diodes such as surface-emitting lasers (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates an LED including large area metal-to-metal interconnects, described in more detail in U.S. Pat. No. 7,348,212. The structure illustrated in FIG. 1 includes a flip chip light emitting device attached to a mount 70. The flip chip device includes a substrate 73 attached to semiconductor device layers 74, which include at least one light emitting or active layer disposed between an n-type region and a p-type region. N-type contact 71 and p-type contact 72 are electrically connected to the n- and p-type regions of semiconductor structure 74. Thin metal layers 76a and 77a are formed on contacts 71 and 72, and thin metal layers 76b and 77b are formed on mount 70. Thick ductile metal layers 78 and 79 are plated on either mount 70 or contacts 71 and 72, thus on either regions 76a and 77a or regions 76b and 77b. Metal layers 78 and 79 are selected to be ductile, have high thermal and electrical conductivity, and be reasonably resistant to oxidation. For example, metal layers 78 and 79 may be Au, which has good thermal conductivity; Cu, which has even better thermal conductivity than Au; Ni; or Al, which is less expensive than Au or Cu. Metal layers 78 and 79 may be between one and 50 microns thick and are often between 5 and 20 microns thick.

SUMMARY

It is an object of the invention to provide a semiconductor device including thick metal layers that mechanically support the semiconductor device such that a mount is not required to support the semiconductor device.

A device according to embodiments of the invention includes a semiconductor structure including a light emitting layer sandwiched between an n-type region and a p-type region and first and second metal contacts, wherein the first metal contact is in direct contact with the n-type region and the second metal contact is in direct contact with the p-type region. First and second metal layers are disposed on the first and second metal contacts, respectively. The first and second metal layers are sufficiently thick to mechanically support the semiconductor structure. A sidewall of one of the first and second metal layers comprises a three-dimensional feature.

A method according to embodiments of the invention includes providing a wafer of semiconductor devices, the wafer including a semiconductor structure including a light emitting layer sandwiched between an n-type region and a p-type region and first and second metal contacts for each semiconductor device, wherein each first metal contact is in direct contact with the n-type region and each second metal contact is in direct contact with the p-type region. First and second metal layers are formed on the first and second metal contacts of each semiconductor device on the wafer, respectively. The first and second metal layers are sufficiently thick to support the semiconductor structure during later processing. Forming first and second metal layers includes forming a three-dimensional feature on a sidewall of one of the first and second metal layers. After forming first and second metal layers, an electrically insulating layer that fills spaces between the first and second metal layers is formed.

BRIEF DESCRIPTION OF THE DRAWINGS

FIGS. 16, 17, 18, 19, 20, and 21 illustrate forming the protrusion anchoring feature illustrated in FIG. 14.

FIG. 22 illustrates a device with reflective sidewalls.

DETAILED DESCRIPTION

Figure 2:
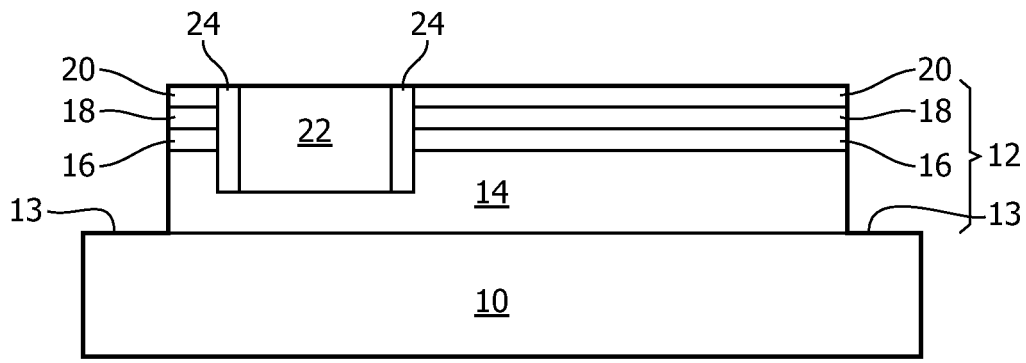
FIG. 2 illustrates a semiconductor LED suitable for use in embodiments of the present invention.

FIG. 2 illustrates a semiconductor light emitting device suitable for use in embodiments of the invention. Though in the discussion below the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

The device illustrated in FIG. 2 may be formed by first growing a semiconductor structure on a growth substrate 10, as is known in the art. The growth substrate 10 may be any suitable substrate such as, for example, sapphire, SiC, Si, GaN, or composite substrates. An n-type region 14 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 16 is grown over the n-type region. Examples of suitable light emitting regions include a single thick or thin light emitting layer, or a multiple quantum well light emitting region including multiple thin or thick light emitting layers separated by bather layers. A p-type region 18 may then be grown over the light emitting region. Like the n-type region, the p-type region may include multiple layers of different composition, thickness, and dopant concentration, including layers that are not intentionally doped, or n-type layers. The total thickness of all the semiconductor material in the device is less than 10 µm in some embodiments and less than 6 µm in some embodiments.

A p-contact metal 20 is formed on the p-type region. The p-contact metal 20 may be reflective and may be a multi-layer stack. For example, the p-contact metal may include a layer for making ohmic contact to the p-type semiconductor material, a reflective metal layer, and a guard metal layer that prevents or reduces migration of the reflective metal. The semiconductor structure is then patterned by standard photolithographic operations and etched to remove a portion of the entire thickness of the p-contact metal, a portion of the entire thickness of the p-type region, and a portion of the entire thickness of the light emitting region, to form at least one mesa which reveals a surface of the n-type region 14 on which a metal n-contact 22 is formed.

Figure 5:
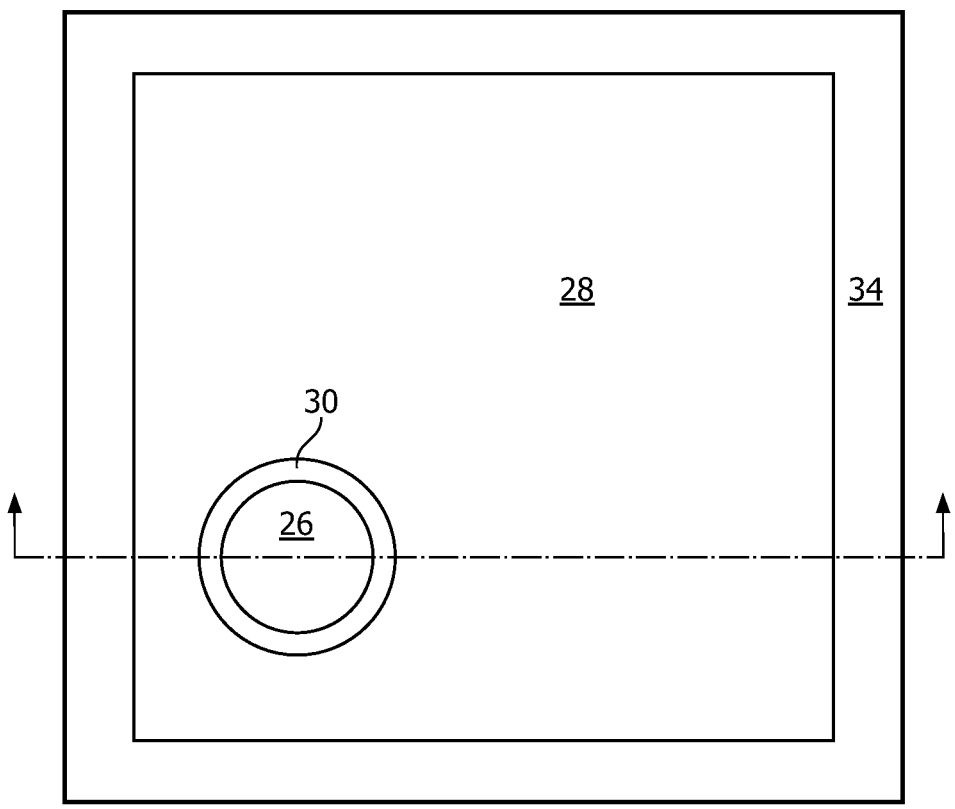
FIG. 5 is a plan view of the structure illustrated in cross sectional view in FIG. 4.

A plan view of the device illustrated in FIG. 2 would look similar to the plan view illustrated in FIG. 5. N-contact 22 may have the same shape as thick metal layer 26, described below. P-contact 20 may have the same shape as thick metal layer 28, described below. The re-contact and the p-contact are electrically isolated by a gap 24 which may be filled with a solid, a dielectric, an electrically insulating material, air, ambient gas, or any other suitable material. The p- and n-contacts may be any suitable shape and may be arranged in any suitable way. Patterning a semiconductor structure and forming n- and p-contacts is well known to a person of skill in the art. Accordingly, the shape and arrangement of the n- and p-contacts is not limited to the embodiment illustrated in FIGS. 2 and 5

Also, though a single light emitting device is illustrated in FIG. 2, it is to be understood that the device illustrated in FIG. 2 is formed on a wafer that includes many such devices. In the regions 13 between individual devices on a wafer of devices, the semiconductor structure may be etched down to an insulating layer, which may be an insulating semiconductor layer that is part of the semiconductor structure, or the growth substrate, as illustrated in FIG. 2.

The LED structure illustrated in FIG. 2, which includes the semiconductor structure including the n-type region, the p-type region, and the light emitting region, and the n- and p-contacts, is represented in simplified form by structure 12 in the following figures.

In embodiments of the invention, thick metal layers are formed on the n- and p-contacts of the LED. The thick metal layers may be formed on a wafer scale, before a wafer of devices is diced into individual or smaller groups of devices. The thick metal layers may support the device structure of FIG. 2 after the wafer of devices is diced, and may support the device structure of FIG. 2 during removal of the growth substrate in some embodiments.

Figure 3:
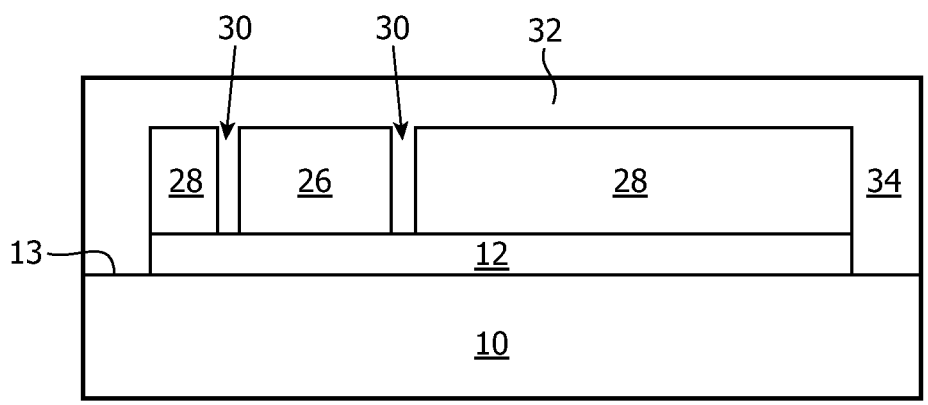
FIG. 3 illustrates thick metal layers formed on the metal contacts of a semiconductor LED.

FIG. 3 illustrates thick metal layers formed on the n- and p-contacts of LED 12. In some embodiments, a base layer, which is not shown in FIG. 3, is formed first. The base layer is a metal layer or layers on which the thick metal layers are deposited. For example, the base layer may include an adhesion layer, the material of which is selected for good adhesion to the n- and p-contacts, and a seed layer, the material of which is selected for good adhesion to the thick metal layers. Examples of suitable materials for the adhesion layer include but are not limited to Ti, W, and alloys such as TiW. Examples of suitable materials for the seed layer include but are not limited to Cu. The base layer or layers may be formed by any suitable technique including, for example, sputtering or evaporation.

The base layer or layers may be patterned by standard lithographic techniques such that the base layer is present only where the thick metal layers are to be formed. Alternatively, a photoresist layer may be formed over the base layer and patterned by standard lithographic techniques to form openings where the thick metal layers are to be formed.

CROSS-REFERENCE TO PRIOR APPLICATIONS

Thick metal layers 26 and 28 are formed simultaneously over the n- and p-contacts of LED 12. Thick metal layers 26 and 28 may be any suitable metal such as, for example, copper, nickel, gold, palladium, nickel-copper alloy, or other alloys. Thick metal layers 26 and 28 may be formed by any suitable technique including, for example, plating. Thick metal layers 26 and 28 may be between 20 µm and 500 µm in some embodiments, between 30 µm and 200 µm in some embodiments, and between 50 µm and 100 µm in some embodiments. Thick metal layers 26 and 28 support the semiconductor structure during later processing steps, in particular removal of the growth substrate, and provide a thermal pathway to conduct heat away from the semiconductor structure, which may improve the efficiency of the device.

After thick metal layers 26 and 28 are formed, an electrically insulating material 32 is formed over the wafer. The electrically insulating material 32 fills gaps 30 between the thick metal layers 26 and 28 and also fills gaps 34 between LEDs 12. The electrically insulating material 32 may optionally be disposed over the tops of thick metal layers 26 and 28. Electrically insulating material 32 is selected to electrically isolate metal layers 26 and 28 and to have a coefficient of thermal expansion that is matched or is relatively close to that of the metal(s) in thick metal layers 26 and 28. For example, electrically insulating material 32 may be epoxy or silicone in some embodiments. Electrically insulating material 32 may be formed by any suitable technique, including, for example, overmolding, injection molding, spinning on, and spraying on. Overmolding is performed as follows: An appropriately sized and shaped mold is provided. The mold is filled with a liquid material, such as silicone or epoxy, which when cured forms a hardened electrically insulating material. The mold and the LED wafer are brought together. The mold is then heated to cure (harden) the electrically insulating material. The mold and the LED wafer are then separated, leaving the electrically insulating material 32 over the LEDs, between the LEDs, and filling any gaps on each LED. In some embodiments, one or more fillers are added to the molding compound to form composite materials with optimized physical and material properties.

Figure 4:
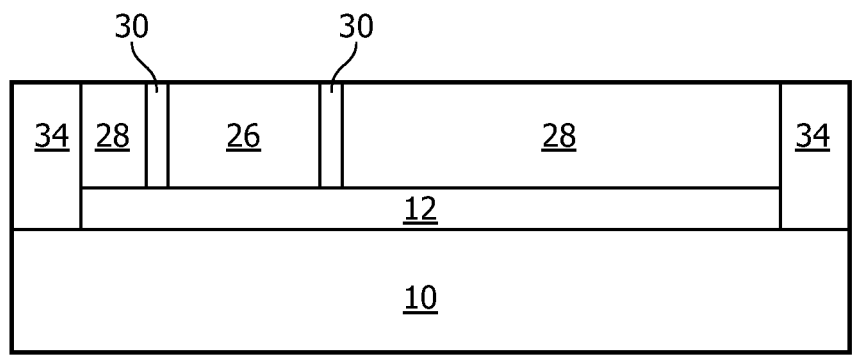
FIG. 4 illustrates the structure of FIG. 3 after planarizing the electrically insulating layer.

FIG. 4 illustrates an optional processing step, where the device is planarized, for example by removing any electrically insulating material overlying thick metal layers 26 and 28. Electrically insulating material 32 may be removed by any suitable technique, including, for example, microbead blasting, fly cutting, cutting with a blade, grinding, polishing, or chemical mechanical polishing. The electrically insulating material 30 between thick metal layers 26 and 28 is not removed, and the electrically insulating material 34 between adjacent LEDs is not removed.

FIG. 5 is a plan view of the structure shown in cross sectional view in FIG. 4. The cross section shown in FIG. 4 is taken at the axis shown in FIG. 5. The thick metal layer 26 formed on the n-contact illustrated in FIG. 2 is circular, though it may have any shape. The thick metal layer 26 is surrounded by the thick metal layer 28 formed on the p-contact illustrated in FIG. 2. Thick metal layers 26 and 28 are electrically isolated by electrically insulating material 30, which surrounds thick metal layer 26. Electrically insulating material 34 surrounds the device.

Figure 6:
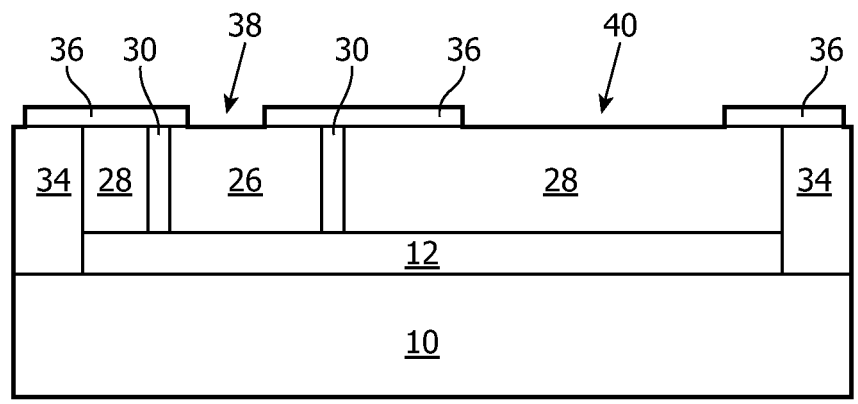
FIG. 6 illustrates the structure of FIG. 4 after patterning an electrically insulating layer formed over the thick metal layers.
Figure 7:
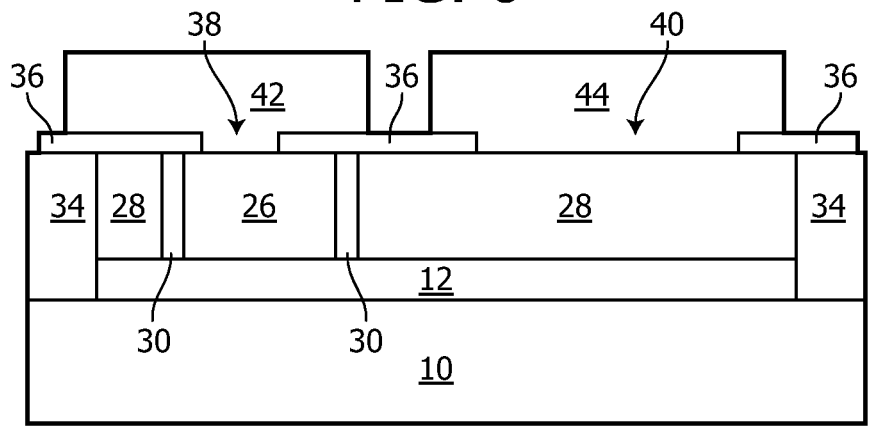
FIG. 7 illustrates the structure of FIG. 6 after forming bonding pads.

The shape and placement of the metal layers electrically connected to the n- and p-type regions may be altered (i.e. thick metal layers 26 and 28 may be redistributed) by forming additional layers of insulating material and metals, as illustrated in FIGS. 6 and 7. In FIG. 6 an electrically insulating layer 36 is formed then patterned by standard lithographic techniques to form an opening 38 aligned with thick metal layer 26 and an opening 40 aligned with thick metal layer 28. Electrically insulating layer 36 may be any suitable material including but not limited to a dielectric layer, a polymer, benzocyclobutene, oxide of silicon, nitride of silicon, silicone, and epoxy. Electrically insulating layer 36 may be formed by any suitable technique including but not limited to plasma enhanced CVD, spinning on, spraying on, and molding.

Figure 1:
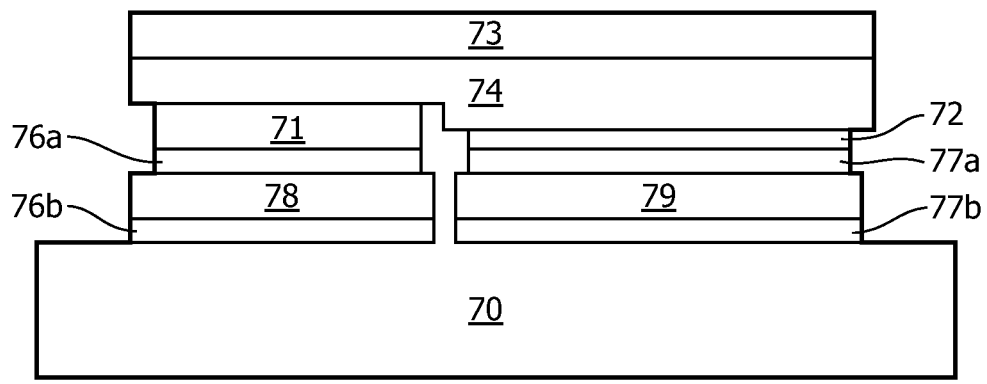
FIG. 1 illustrates a prior art LED with thick, ductile metal interconnects.

In FIG. 7, metal bonding pads 42 and 44 are formed on thick metal layers 26 and 28, respectively, in openings 38 and 40, respectively. In some embodiments, metal bonding pads 42 and 44 are suitable for connection to a structure such as a PC board, for example by reflow-soldering. Bonding pads 42 and 44 may be, for example, nickel, gold, aluminum, alloys, stacks of metals, or solder. Bonding pads 42 and 44 may be formed by any suitable technique, including, for example, plating, sputtering, evaporation, or screen printing. Bonding pad 42 is electrically connected to n-type region 14 of FIG. 1. Bonding pad 44 is electrically connected to p-type region 18 of FIG. 1.

Figure 8:
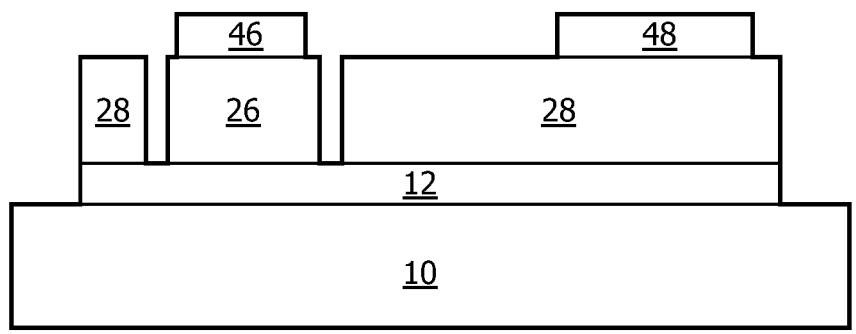
FIG. 8 illustrates thick metal layers and plated redistribution layers formed on the contacts of a semiconductor LED.

An alternative process for forming a device with thick metal layers and bonding pads is illustrated beginning in FIG. 8. In FIG. 8, thick metal layers 26 and 28 are formed, as described above in reference to FIG. 3. Redistribution layers 46 and 48 are then formed on thick metal layers 26 and 28, respectively. Redistribution layers 46 and 48 are smaller than thick metal layers 26 and 28. For example, redistribution layers 46 and 48 may be formed by first forming a photoresist layer over thick metal layers 26 and 28, then patterning the photoresist layer such that openings in the photoresist layer are disposed where redistribution layers 46 and 48 are to be formed. Redistribution layers 46 and 48 are then formed by any suitable technique. For example, redistribution layers 46 and 48 may be copper, formed by plating.

Figure 9:
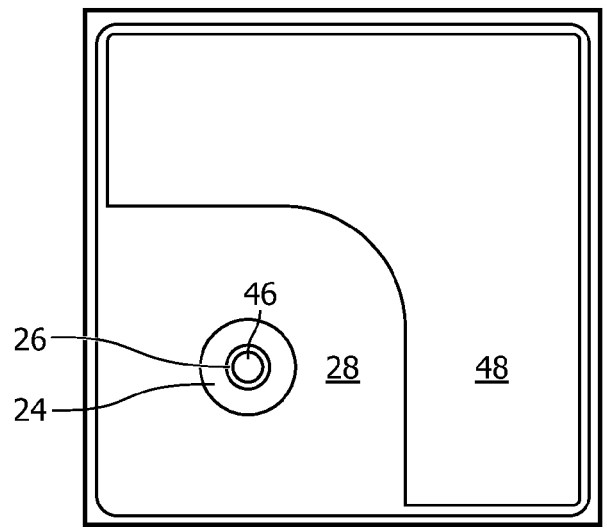
FIG. 9 is a plan view of the structure illustrated in cross sectional view in FIG. 8.

FIG. 9 is an example of a plan view of the structure shown in cross sectional view in FIG. 8. Redistribution layer 46 is formed on thick metal layer 26, which is surrounded by thick metal layer 28. Gap 24 electrically isolates thick metal layers 26 and 28. Redistribution layer 48 is formed on thick metal layer 28 but has a smaller lateral extent than thick metal layer 28.

Figure 10:
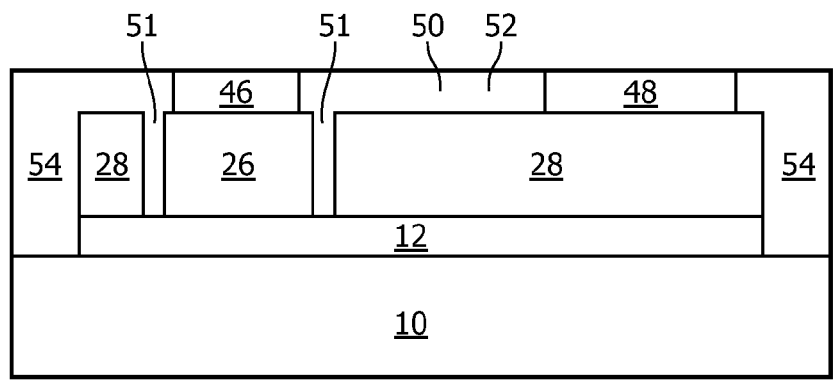
FIG. 10 illustrates the structure of FIG. 8 after forming and planarizing an electrically insulating layer.

In FIG. 10, an electrically insulating material 50 is formed over the structure illustrated in FIG. 8, as described above in reference to FIG. 3. The electrically insulating material is then planarized, as described above in reference to FIG. 4. Electrically insulating material 50 fills the gaps 51 between thick metal layers 26 and 28, the gap 52 between redistribution layers 46 and 48, and the gaps 54 between neighboring LEDs.

Figure 11:
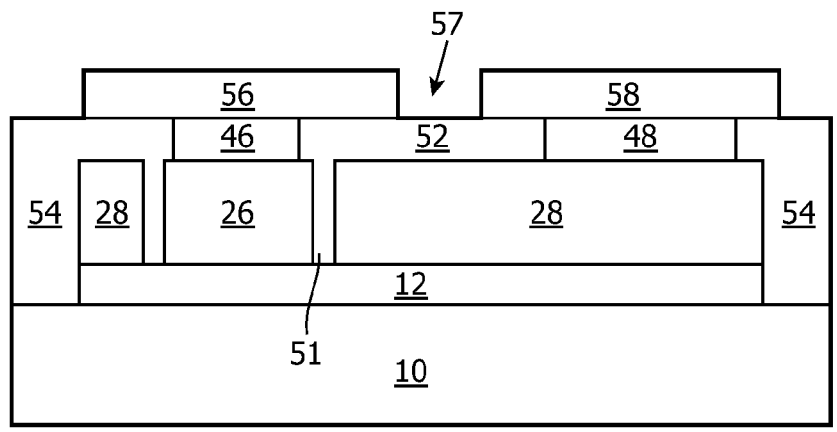
FIG. 11 illustrates the structure of FIG. 10 after forming bonding pads.
Figure 12A:
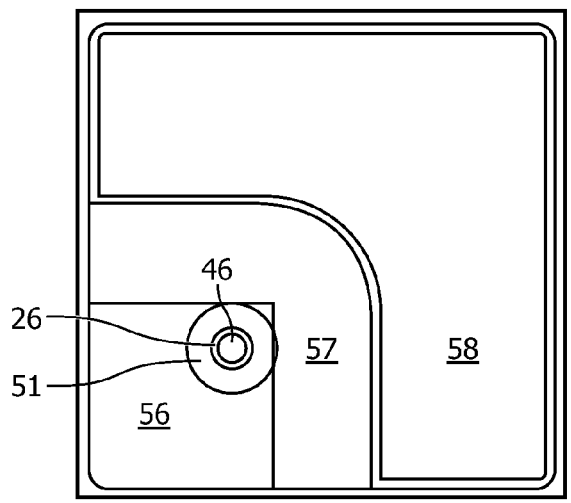
FIGS. 12A and 12B are plan views of different implementations of the structure illustrated in cross sectional view in FIG. 11.
Figure 12B:
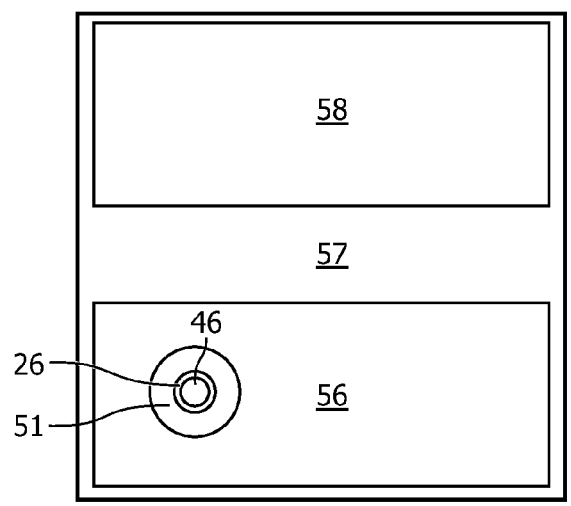

In FIG. 11, bonding pads 56 and 58 are formed over redistribution layers 46 and 48, respectively. Bonding pads 56 and 58 may be the same as the bonding pads described above in reference to FIG. 7. FIGS. 12A and 12B show examples of plan views of the structure shown in cross sectional view in FIG. 11. In the embodiment illustrated in FIG. 12A, bonding pad 56, which is electrically connected to redistribution layer 46, has a much larger lateral extent than redistribution layer 46 and thick metal layer 26. Bonding pad 58, which is electrically connected to redistribution layer 48, has a similar lateral extent as redistribution layer 48. In the embodiment illustrated in FIG. 12B, bonding pad 56 is substantially the same size and shape as bonding pad 58. A gap 57 electrically isolates bonding pads 56 and 58.

In some embodiments, the growth substrate 10 is removed from the structure illustrated in FIG. 7 or the structure illustrated in FIG. 11. The growth substrate may be removed by any suitable technique, including, for example, laser lift-off, etching, mechanical techniques such as grinding, or a combination of techniques. In some embodiments, the growth substrate is sapphire and is removed by wafer-scale laser lift-off. Since the sapphire substrate does not need to be thinned before removal and has not been diced, it can be reused as a growth substrate. The surface of the semiconductor structure exposed by removing the growth substrate, typically a surface of n-type region 14, may be optionally thinned and roughened, for example by photoelectrochemical etching. In some embodiments, all or part of the growth substrate remains part of the final device structure.

The wafer of devices is then diced into individual or groups of LEDs. Individual or groups of LEDs may be separated by sawing, scribing, breaking, cutting, or otherwise separating the electrically insulating material 34 or 54 between neighboring LEDs.

As illustrated in FIGS. 7 and 11, the electrically insulating material 34, 54 between neighboring LEDs may be narrow relative to its height, which may cause the electrically insulating material to pull away from the sides of LED 12 and thick metal layer 26 or 28 during dicing. If the electrically insulating material 34, 54 pulls away from LED 12, the lack of support can cause LED 12 to crack, which can lead to poor device performance or even device failure.

Figure 13:
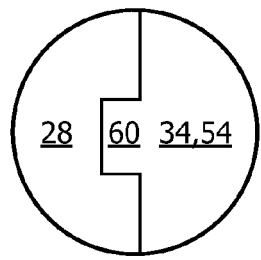
FIG. 13 illustrates a portion of a thick metal layer with a depression to anchor the electrically insulating material.
Figure 14:
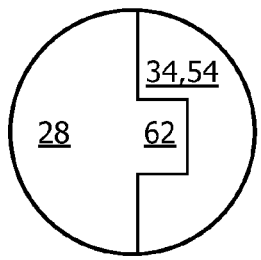
FIG. 14 illustrates a portion of a thick metal layer with a protrusion to anchor the electrically insulating material.
Figure 15:
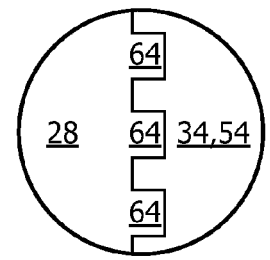
FIG. 15 illustrates a portion of a thick metal layer with multiple features to anchor the electrically insulating material.

In some embodiments, three-dimensional anchoring features are formed on the side of the thick metal layer in contact with the electrically insulating material 34, 54 at the edge of LED 12, in order to anchor the electrically insulating material 34, 54 in place. The three-dimensional anchoring features interrupt the smooth, flat sidewall of the thick metal layer. Examples of anchoring features are illustrated in FIGS. 13, 14, and 15. Though FIGS. 13, 14, and 15 show the anchoring features formed on the sidewall of thick metal layer 28, which is electrically connected to p-type region 18, anchoring features may be formed on either thick metal layer 26 or thick metal layer 28, or both. Also, alternatively or in addition to forming anchoring features on a sidewall facing the edge of a device, anchoring features may be formed on the sidewall of a thick metal layer that is in the interior of the LED (for example, on the sidewall of thick metal layer 26 or 28 that is in contact with electrically insulating material 51, as illustrated in FIG. 11).

In the structure illustrated in FIG. 13, the anchoring feature is a depression 60 formed in the otherwise flat sidewall of thick metal layer 28. Depression 60 fills with electrically insulating material 34, 54 to anchor the electrically insulating material.

In the structure illustrated in FIG. 14, the anchoring feature is a protrusion 62 protruding from the otherwise flat sidewall of thick metal layer 28.

In the structure illustrated in FIG. 15, the anchoring feature is a series of depressions and/or protrusions 64.

Depression 60 or protrusion 62 may be formed by a series of metal forming, electrically insulating material forming, planarizing, and patterning steps as illustrated in FIGS. 16, 17, 18, 19, 20, and 21. Only a portion of a thick metal layer 28 is illustrated. A thick metal layer 26 with anchoring features could also be formed as illustrated. The process described in FIGS. 16, 17, 18, 19, 20, and 21 can be used with either the process illustrated in FIGS. 3, 4, 6, and 7 or the process illustrated in FIGS. 8, 10, and 11. Though in the description below, the metal layer portions are formed by plating and the electrically insulating material portions are formed by molding, any suitable metal deposition or insulating material deposition technique can be used.

In FIG. 16, a first portion 28A of the thick metal layer is plated over LED 12, as described above. In FIG. 17, a first portion 34A of electrically insulating material 34 or 54 is molded over first metal portion 28A, then planarized, as described above. A photoresist layer is then formed and patterned to form openings where second portion 28B of thick metal layer 28 is to be formed. In FIG. 18, second metal portion 28B is plated on first metal portion 28A. As shown in FIG. 18, second metal portion 28B has a larger lateral extent than first metal portion 28A. In FIG. 19, a second portion 34B of electrically insulating material 34 or 54 is molded over second metal portion 28B, then planarized. A photoresist layer is then formed and patterned to form openings where third portion 28C of thick metal layer 28 is to be formed. In FIG. 20, third metal portion 28C is plated on second metal portion 28B. As shown in FIG. 20, third metal portion 28C has a smaller lateral extent than second metal portion 28B. The portion of second metal portion 28B that extends beyond first metal portion 28A and third metal portion 28C forms protrusion 62, which anchors electrically insulating material 34A, 34B, and 34C. It will be clear to a person of skill in the art that the processing steps illustrated in FIGS. 16, 17, 18, 19, 20, and 21 can be modified and/or repeated to form any of the structures illustrated in FIGS. 13, 14, and 15.

In the structures described above, the sides of the device, i.e. the sides of electrically insulating material 34 in FIGS. 7 and 54 in FIG. 11, may be absorbing to light. Particularly in applications that make use of mixing chambers, it is important that all surfaces be as reflective as possible. In some embodiments, a reflective material is added to insulating material 34, 54, such that after dicing, the sides of electrically insulating material 34, 54 are reflective. For example, highly reflective $TiO_2$ and/or calcium silicate particles may be mixed with the electrically insulating material, which may be epoxy or silicone, for example, that is molded or otherwise disposed over the wafer, as described above for example in reference to FIG. 3.

In some embodiments, in addition to or instead of reflective material, thermally conductive material may be added to insulating material 34, 54. For example, particles of aluminum nitride, $SiO_2$, graphite, BN, or any other suitable material can be added to insulating material 34, 54 to improve the thermal conductivity of the structure and/or to engineer the coefficient of thermal expansion (CTE) of the insulating material to more closely match the CTE of the semiconductor structure, the thick metal layers, or both.

In some embodiments, as illustrated in FIG. 22, the device is diced such that the edges of the device are the sidewalls of thick metal layer 28, rather than electrically insulating material 34, 54. In some embodiments, after dicing, the sidewalls of thick metal layer 28 treated, for example by wet chemical etching, to reduce surface roughness. Reducing the surface roughness may increase the reflectivity of the sidewalls. In some embodiments, after dicing, while the device is still attached to the handling foil used for dicing, a reflective metal coating 66 such as an Al, Ni, Cr, Pd, or Ag coating, a reflective alloy, or a stack of reflective coatings, is formed on the sides of thick metal layer 28, for example by physical vapor deposition or electroless plating.

In some embodiments, the side coating 66 is an insulating reflective material that is placed over the sidewalls of the device after the device is diced, while the device is still attached to the handling foil for dicing. For example, individual devices may be separated and while the individual devices are on the handling foil, the separation lanes may be filled with a highly reflective material. The highly reflective material may then be separated again. The wafer of devices can be formed with separation lanes wide enough to accommodate two separation steps, or the handling foil can be stretched twice to accommodate two separation steps. Examples of suitable reflective materials include silicone, or a transparent material such as silicone or epoxy filled with reflective particles such as $TiO_2$ particles.

One or more optional structures such as filters, lenses, dichroic materials, or wavelength converting materials may be formed over the LEDs, before or after dicing. A wavelength converting material may be formed such that all or only a portion of the light emitted by the light emitting device and incident on the wavelength converting material may be converted by the wavelength converting material. Unconverted light emitted by the light emitting device may be part of the final spectrum of light, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting material, and a UV-emitting LED combined with blue-, green-, and red-emitting wavelength converting materials. Wavelength converting materials emitting other colors of light may be added to tailor the spectrum of light emitted from the device. The wavelength converting material may be conventional phosphor particles, quantum dots, organic semiconductors, II-VI or III-V semiconductors, II-VI or III-V semiconductor quantum dots or nanocrystals, dyes, polymers, or materials such as GaN that luminesce. Any suitable phosphor may be used, including but not limited to garnet-based phosphors such as $Y_3Al_5O_{12}$:Ce (YAG), $Lu_3Al_5O_{12}$:Ce (LuAG), $Y_3Al_{5-x}Ga_xO_{12}$:Ce (YAlGaG), $(Ba_{1-x}Sr_x)SiO_3$:Eu (BOSE), and nitride-based phosphors such as $(Ca,Sr)AlSiN_3$:Eu and $(Ca,Sr,Ba)_2Si_5N_8$:Eu.

The thick metal layers 26 and 28 and the electrically insulating material that fills gaps between the thick metal layers and between neighboring LEDs provide mechanical support to the semiconductor structure, such that an additional mount such as a silicon or ceramic mount is not required. Eliminating the mount may reduce the cost of the device and may simplify the processing required to form the device.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
   a semiconductor structure comprising a light emitting layer sandwiched between an n-type region and a p-type region;
   first and second metal contacts, wherein the first metal contact is in direct contact with the n-type region and the second metal contact is in direct contact with the p-type region;
   first and second metal layers disposed on the first and second metal contacts, respectively,
   wherein the first and second metal layers are sufficiently thick to mechanically support the semiconductor structure, wherein a sidewall of one of the first and second metal layers comprises a three-dimensional feature, and wherein a width of the first or second metal layer above and below the three-dimensional feature is the same, and a width of the first or second metal layer in a region of the three-dimensional feature is different from the width above and below the three-dimensional feature.

2. The device of claim 1 wherein the first and second metal layers are copper layers.

3. The device of claim 1 wherein the three-dimensional feature comprises a protrusion protruding from an otherwise flat sidewall.

4. The device of claim 1 wherein the three-dimensional feature comprises a depression formed in an otherwise flat sidewall.

5. The device of claim 1 wherein the three-dimensional feature comprises a series of protrusions.

6. The device of claim 1 further comprising an electrically insulating material disposed in direct contact with the three-dimensional feature.

7. The device of claim 1 wherein the first and second metal layers are thicker than 50 μm.

8. A method comprising:
   providing a wafer of semiconductor devices, the wafer comprising:
   a semiconductor structure comprising a light emitting layer sandwiched between an n-type region and a p-type region; and
   first and second metal contacts for each semiconductor device, wherein each first metal contact is in direct contact with the n-type region and each second metal contact is in direct contact with the p-type region;
   forming first and second metal layers on the first and second metal contacts of each semiconductor device on the wafer, respectively, wherein the first and second metal layers are sufficiently thick to support the semiconductor structure during later processing, wherein forming first and second metal layers comprises forming a three-dimensional feature on a sidewall of one of the first and second metal layers, and wherein a width of the first or second metal layer above and below the three-dimensional feature is the same, and a width of the first or second metal layer in a region of the three-dimensional feature is different from the width above and below the three-dimensional feature;
   after forming first and second metal layers, forming an electrically insulating layer that fills spaces between the first and second metal layers.

9. The method of claim 8 wherein forming first and second metal layers comprises plating first and second metal layers on a wafer.

10. The method of claim 9 wherein forming a three-dimensional feature comprises:
    plating a first portion of the first and second metal layers;
    plating a second portion of the first and second metal layers on the first portion of the first and second metal layers, wherein the second portion has a different lateral extent than the first portion; and
    plating a third portion of the first and second metal layers on the second portion of the first and second metal layers, wherein the third portion has a different lateral extent than the second portion.

11. The method of claim 10 further comprising:
    after plating a first portion, molding a first portion of an electrically insulating layer over the first portion of the first and second metal layers;
    after plating a second portion, molding a second portion of an electrically insulating layer over the second portion of the first and second metal layers; and
    after plating a third portion, molding a third portion of an electrically insulating layer over the third portion of the first and second metal layers.

12. The method of claim 8 wherein the first and second metal layers are thicker than 50 μm.

13. The method of claim 8 wherein the electrically insulating layer is a first electrically insulating layer, the method further comprising:
    disposing a second electrically insulating layer over the wafer;
    forming a first opening in the second electrically insulating layer aligned with the first metal layer and a second opening in the second electrically insulating layer aligned with the second metal layer; and
    forming a first metal bonding pad aligned with the first opening and forming a second metal bonding pad aligned with the second opening.

14. The method of claim 8 wherein the semiconductor structure is grown on a growth substrate, the method further comprising removing the growth substrate after forming the first and second metal layers.

15. The method of claim 8 further comprising dicing the wafer into individual or groups of semiconductor devices after forming the first and second metal layers.

16. The device of claim 1 further comprising a uniform, continuous layer of electrically insulating material disposed in direct contact with the three dimensional feature, with a region of the sidewall above the three dimensional feature, and with a region of the sidewall below the three dimensional feature.

17. The method of claim 8 wherein forming an electrically insulating layer that fills spaces between the first and second metal layers comprises forming, in a single process, a uniform, continuous layer of electrically insulating material disposed in direct contact with the three dimensional feature, with a region of the sidewall above the three dimensional feature, and with a region of the sidewall below the three dimensional feature.

\* \* \* \* \*